United States Patent [19]

Yen et al.

[11] Patent Number: 4,583,055
[45] Date of Patent: Apr. 15, 1986

[54] SPATIAL POWER COMBINER

[75] Inventors: Huan-Chun Yen, Torrance; Danilo Radovich, Long Beach, both of Calif.

[73] Assignee: Hughes Aircraft Company, El Segundo, Calif.

[21] Appl. No.: 566,254

[22] Filed: Dec. 28, 1983

[51] Int. Cl.[4] .......................................... H03B 25/00
[52] U.S. Cl. ......................................... 331/55; 331/96
[58] Field of Search ................... 331/55, 56, 96, 99; 330/53, 56, 286; 333/128; 343/376

[56] References Cited

U.S. PATENT DOCUMENTS 3,393,375  7/1968  Barber et al. ...................... 331/56

Primary Examiner—Eugene LaRoche
Assistant Examiner—G. Wan
Attorney, Agent, or Firm—John Holtrichter, Jr.; Kenneth W. Float; A. W. Karambelas

[57] ABSTRACT

The spatial power combiner disclosed here is used to efficiently combine the power sources, which incorporate two-terminal negative resistance devices, in a coherent manner such that a high power output with a stable and definite frequency and phase is obtained, the sources to be combined being arranged in an array configuration.

14 Claims, 15 Drawing Figures

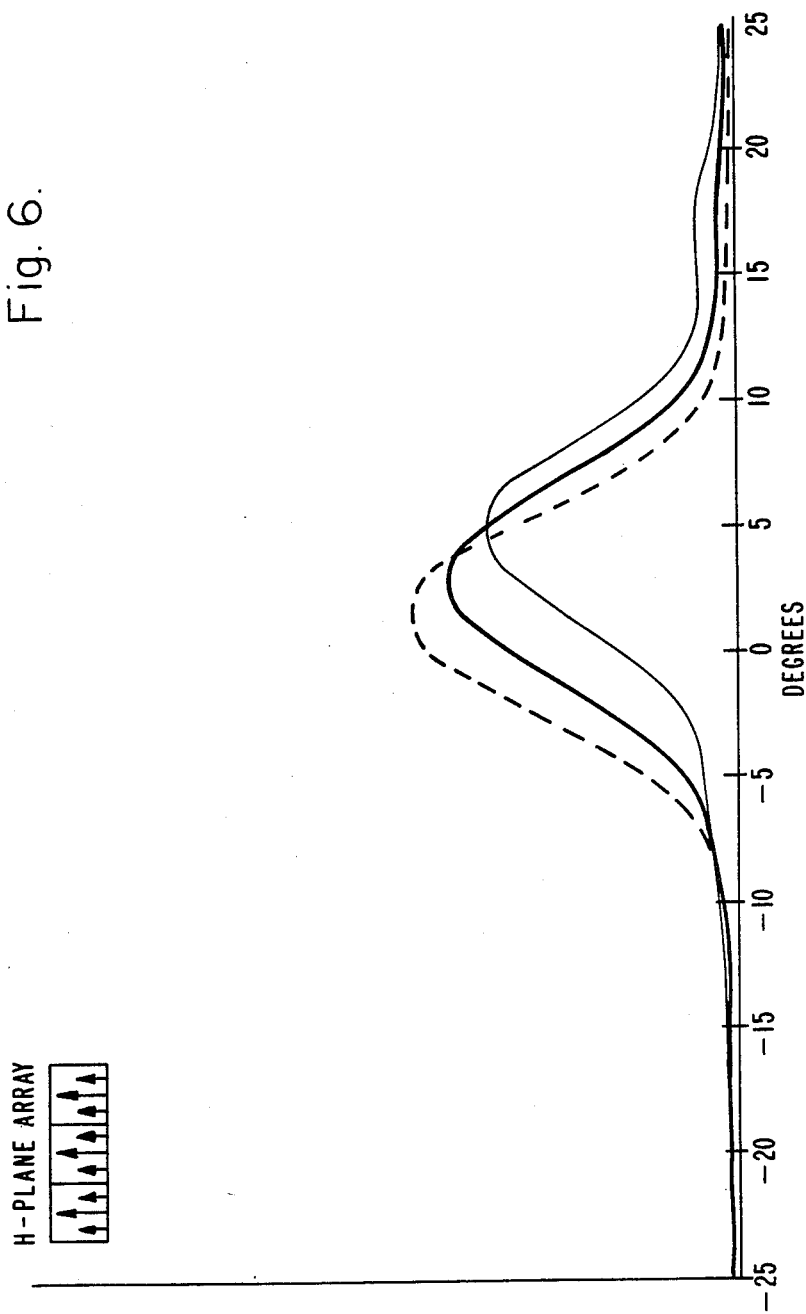

Fig. 14.
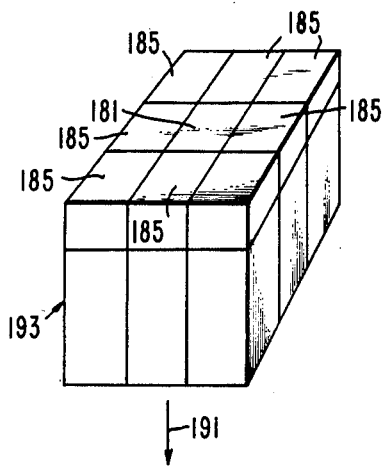
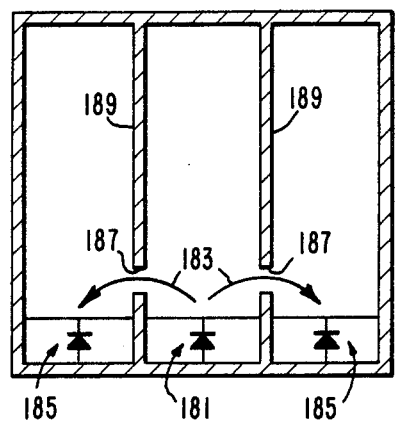
Fig. 15.

SPATIAL POWER COMBINER

BACKGROUND OF THE INVENTION

1. Field of the Invention

This invention relates generally to spatial power combiners and, more particularly, to such combiners which incorporate solid state-two-terminal negative resistance devices and which operate in the millimeter-wave and microwave frequency regions.

2. Description of the Prior Art

Despite the rapid progress made during the past years with the solid state millimeter-wave devices, the output power from a single device still falls short of the power required for some system applications, such as in radar and communication systems.

Even though the power output from a single device can still be improved through better design and better processing techniques, the attainable power from a single solid state device will ultimately be limited by some very fundamental device physics, such as maximum attainable power density and thermal considerations.

Power combining has long been recognized as a viable approach to overcome this obstacle. Several combining schemes under development in the past have yielded varying degrees of success. One such scheme is a chip-level combiner which has been successfully demonstrated at x-band with a good combining efficiency. Difficulties arise, however, when the chip configuration is scaled down for operation at higher frequencies (>40 GHz). Control of mode stability and exessive RF losses seem to be the main problem. The device is very narrow band since the frequency of oscillation is mostly determined by the parasitic elements, which also hamper the optimization process. At very high frequencies, the number of chips that can be combined will be limited as the overall physical size begins to approach the characteristic wavelength. Consequently, the distributive nature and the possibility of the onset of the circuit modes can not be ignored.

Another scheme makes use of either resonant or non-resonant structure as a medium for power combining, and is generally known as a circuit-level combiner. For the resonant type, both cylindrical and rectangular waveguide resonator combiners have been extensively developed with impressive results. Notably, the Kurokawa-type rectangular resonator combiners have proven quite effective up to 217 GHz. Inherent limitations of a closed resonator combiner are its high mode density and narrow operational bandwidth. In addition, since practical packaged devices are finite in size, it becomes difficult to accommodate more than a few devices inside a resonator at high millimeter-wave frequencies without incurring serious moding problems and diode mutual coupling. Open resonant structures, such as a Fabry-Perot resonator, alleviate the problem associated with mode crowding considerably. However, little development work has been carried out in this area and no significant results are known.

As for non-resonant type circuit-level power combiners, both conical and radial line combining structures have been used in the microwave frequency range yielding some reasonable results. Since no resonant modes are involved in the combining process, these structures tend to have a wider operational bandwidth and are capable of accommodating a number of devices. Efforts to extend these technologies into millimeter-wave frequencies have not been met with comparable success due to difficulties in achieving the required mode stability and device-to-device isolation at these frequencies. Furthermore, the complexity required to implement mode filters and absorbing material within a millimeter-wave combiner structure renders these methods quite difficult.

Still another power combining scheme is known as a module-level combiner, and is characterized by the network-like topology to which the modules to be combined are connected and from which a resultant combined power is extracted. Since the modules can be single-device sources or combiners, the module-level combining can be used in conjunction with any combining methods described above including another module-level combiner.

Hybrid combiners employ the well known 3 db quadrature hybrid coupler as a basic combining component to form the combining network. The phasing requirement is accomplished by an appropriate circuit arrangement and an external injection lock. This method is rather straight-forward and has good operating bandwidth as well as good port-to-port isolation. However, as the number of modules to be combined increases, the hardware required along with the accompanying RF losses also increase until an optimal number is obtained beyond which the added power is offset by the RF losses. In practice, this optimal number is limited to 16 or less, depending on the frequency range. For the small number of power modules to be combined, this is a very low risk approach.

Another module-level combiner uses the N-way power divider/combiner technique which is very simple in principle, and is widely applied at lower microwave and RF frequencies. While the hybrid coupler combining scheme discussed above is more naturally applicable to one-port reflection type power modules (e.g., IMPATT sources) in the sense that circulators are not required, the N-way divider/combiner method requires separate input and ouput on the N-stages or chains of stages whose power is to be combined. Consequently, for IMPATT-type power modules, this scheme requires a large number of circulators to direct the power flow. It has, however, the important potential advantage of possessing truely graceful degradation characteristics in the event one or more of the combiner modules fails. To achieve this condition, the port-to-port isolation must be sufficiently high, which is difficult to achieve over a wide bandwidth for frequencies above approximately 40 GHz. For frequencies higher than 100 GHz, a Wilkinson-type N-way divider/combiner using dielectric waveguide seems promising, except that several key technologies, such as incorporating the circulators in a dielectric waveguide environment and establishing sufficient isolation among the combining parts, must be developed before this scheme can be realized.

In contrast to the above-described methods for combining the power of a plurality of power generating devices, the invention utilizes the spatial power combiner (SPC) technique which combines power through the space between a radiating aperture and a collecting aperture in a phased array where the desired phasing is achieved over the entire active radiating aperture simply and cheaply.

SUMMARY OF THE INVENTION

In view of the foregoing factors and conditions characteristic of the prior art, it is a primary object of the present invention to provide a new and improved spatial power combiner.

It is another object of the present invention to provide a spatial power combiner capable of combining a large number of power sources.

It is still another object of the present invention to provide a spatial power combiner exhibiting low overall loss and high combining efficiency.

It is yet another object of the present invention to provide a physically small and lightweight spatial power combiner having beam steering capability and compatible with both metallic and dielectric waveguide systems.

It is a further object of the present invention to provide a spatial power combiner utilizing simple phase synchronization methods that require only moderate mechanical tolerance and which are compatible with low cost integrated design and fabrication.

In accordance with one embodiment of the invention, a spatial power combiner is provided for efficiently combining a plurality of power sources which includes oscillation means including a plurality of two-terminal negative resistance devices for producing free-running oscillation energy from each of the negative resistance devices. A waveguide array is included which has separate waveguide sections, each section including one of the negative resistance devices, the sections having interelement separation and individual radiation patterns resulting in an array main beam lobe having a relatively small bandwidth compared to array element beam width when phase synchronized. The invention also includes phase synchronization means including an injection signal source producing injection signal energy coupled to each of the negative resistance devices for synchronizing the independent free-running oscillation energy generated by the devices to the injection signal.

The phase synchronization may be provided by illumination injection locking, illuminated subreflector injection locking, coupler-coupled injection locking, and master-slave injection locking techniques.

The features of the present invention, which are believed to be novel, are set forth with particularity in the appended claims. The present invention, both as to its organization and manner of operation and use together with further objects and advantages thereof, may be understood by making reference to the following description taken in conjunction with the accompanying drawings in which like reference characters refer to like elements in the several views.

BRIEF DESCRIPTION OF THE DRAWINGS

FIGS. 6 and 8 illustrate the respective beam pattern in the H- and E-plane from a single source (shown in FIGS. 4 and 5) with all other sources turned off including the injection source, while

FIG. 14 illustrated a master-slave injection locking embodiment according to the invention; and FIG. 15 is a cross-sectional view of the embodiment of FIG. 14.

DETAILED DESCRIPTION OF THE INVENTION

Figure 1:
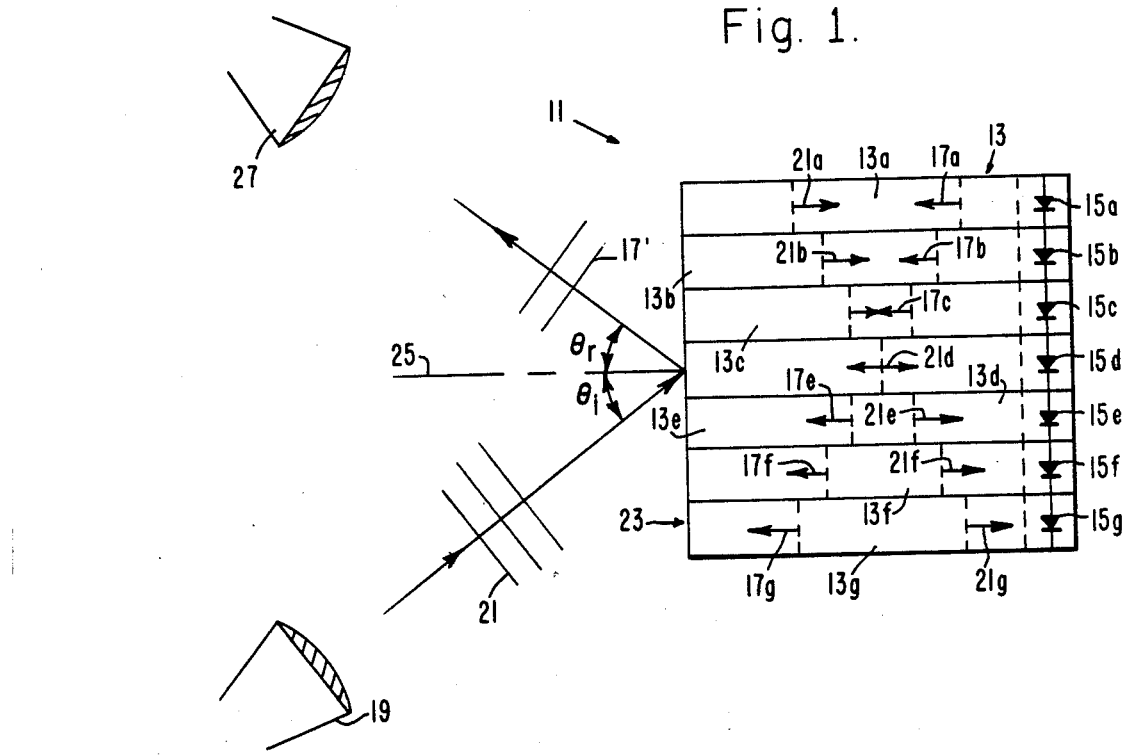
FIG. 1 is a side elevational representation of a spatial power combiner in accordance with the present invention.

Referring now to the drawings and, in particular, to the embodiment of the invention shown in FIG. 1, there is shown a spatial power combiner 11 having a waveguide array 13 with a plurality of separate waveguide sections 13a–13g, each of these sections including a two-terminal negative resistance device, 15a–15g each capable of independently producing, when appropriately energized in a conventional manner, free running oscillation high power energy as indicated by wavefronts 17a–17g. The energization may, for example, be provided by a bias voltage from a conventional bias voltage supply, not shown for the sake of simplicity. The waveguide sections of the array 13 have a predetermined interelement separation and individual radiation patterns which result in an energy main beam output lobe pattern having a relatively small bandwidth compared to individual array element beam widths when phase synchronized.

The invention also includes a conventional injection signal source 19 producing an injection locking signal wavefront 21 coupled to each of the negative resistance devices 15 in order to phase synchronize the independent free running oscillation generated by these devices to the injection signal 21.

In this embodiment, the injection source 19 is positioned to produce "illumination injection locking." As can be seen in FIG. 1, the injection locking wavefront 21' (which need not be a plane wave) is incident at the open end 23 of the array 13 at an incident angle $\theta_i$ with respect to the axis 25 of the array. Also shown, is the coherently combined output power wavefront 17' leaving the array at an angle $\theta_r$ with respect to the axis 25 and being collected by a conventional collecting aperture 27.

Mechanical beam steering is thus possible by mechanical steering of the active array 13 or the change of the incident angle, $\theta_i$, of the injection locking signal 21, similar to the reflection from the interface of an optical beam. Of course, electronic beam steering can also be achieved by varying the DC bias supplied to all or some of the negative resistance devices 15 in some systematic manner well known in the art, because the oscillation of these devices is a strong function of the bias conditions. In addition, traditional electronically controlled phase shifters or dielectric loads can be incorporated into the active array to effect the beam steering or phase trimming.

Figure 2:
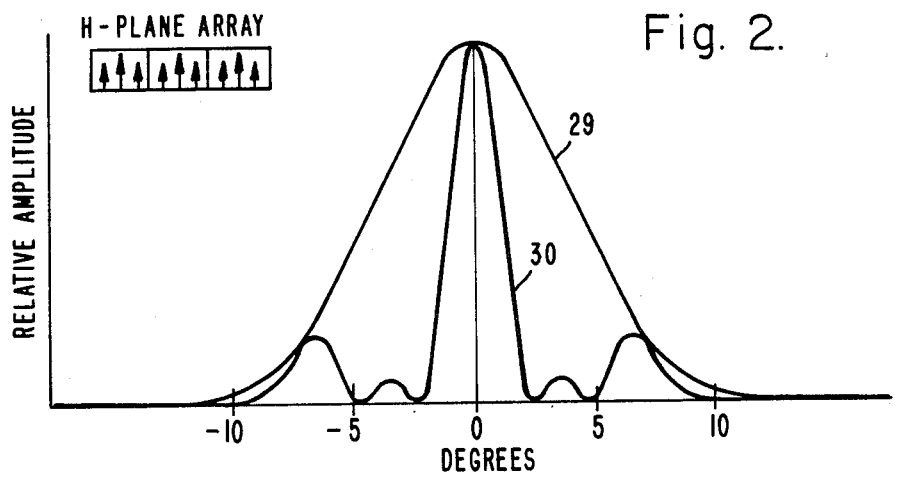
FIGS. 2 and 3 are, respectively, theoretical patterns for the numeral 3-element H-plane and E-plane array embodiments of the invention, each figure including the pattern for the standard gain horn attached to the output part of each power module.
Figure 3:
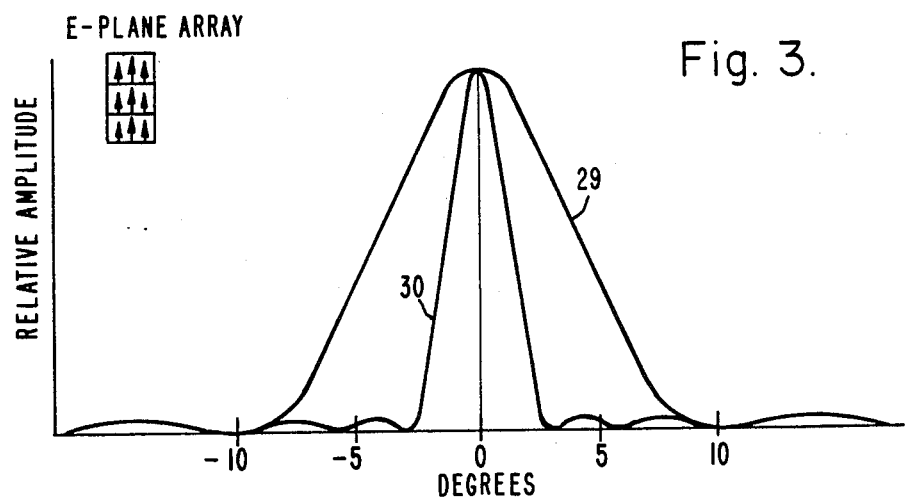

The invention is particularly adaptable for use as a one-dimensional linear array or a two-dimensional planar array. For these cases, the ideal array pattern is the product of an element pattern and an array factor that depends on element separation, and amplitude and phase distortion. An example is shown in FIGS. 2 and 3, where the resultant beams in both E- and H-planes from a 3-element injection-locked array are shown. Curve 29 traces a single source pattern (standard gain horn pattern), and curve 30 shows a 3-element array pattern.

Figure 4:
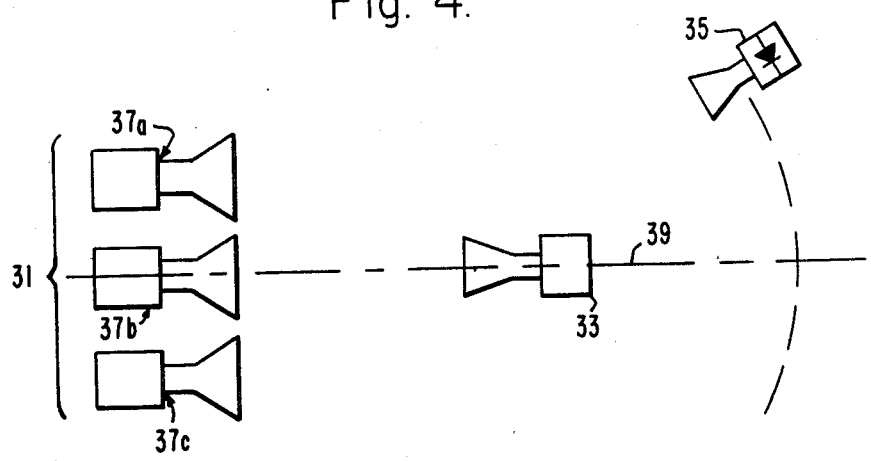
FIGS. 4 and 5 are, respectively, top and side schematically represented views of a 3-element injection locked array embodiment of the spatial power combiner according to the invention.
Figure 5:
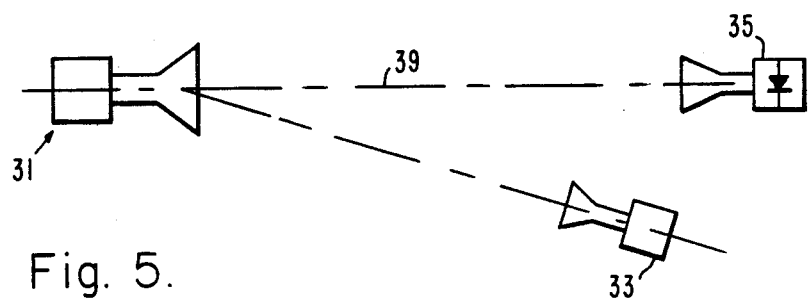

The configuration of a constructed prototype is shown in FIGS. 4 and 5 where an active array is identified by reference number 31, an injection source by number 33, and a receiver (detector) 35. Here, phasing is achieved by injection locking all three power sources 37a-37c with the lower power injecting source 33 disposed in front of the linear array 31 but off the array axis 39, as seen in the side view of FIG. 5. As is well known in the art, fine tuning with dielectric rods (not shown) can be provided for each module 37 to compensate for possible phase errors. Even with such a simple phasing mechanism, very good results have been obtained as shown in FIGS. 6-9.

Figure 7:
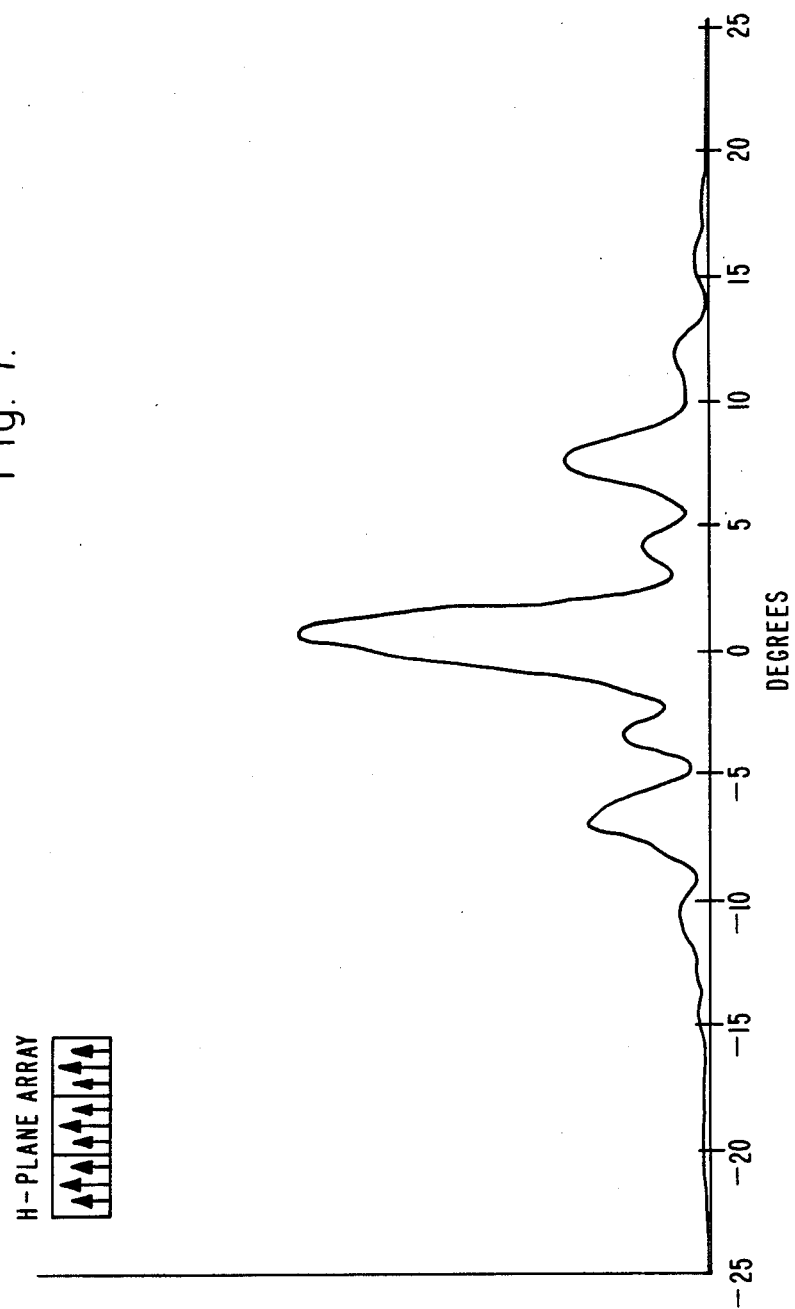
FIGS. 7 and 9 illustrate the resultant coherent beam patterns for the corresponding planes when locking power was injected.
Figure 8:
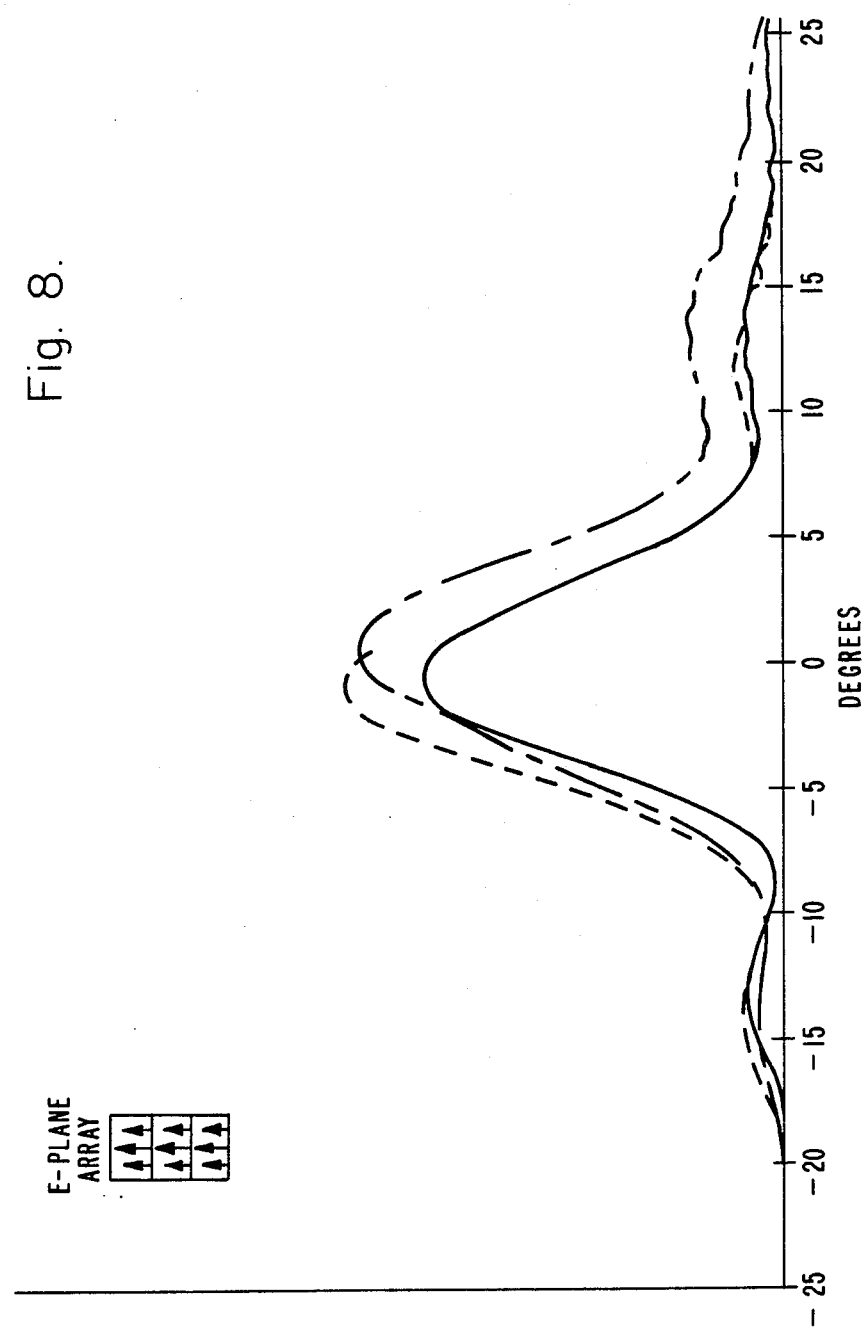
Figure 9:
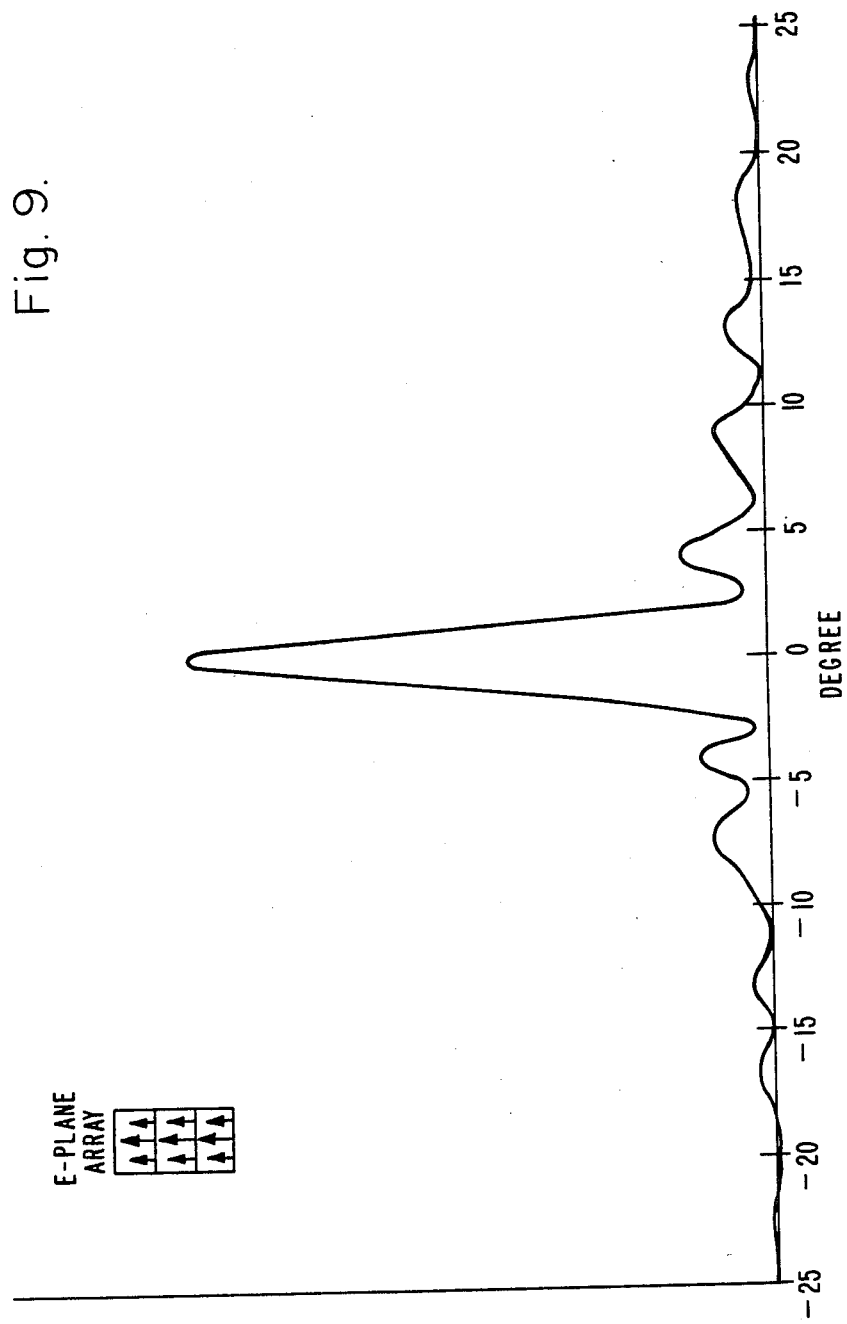

FIGS. 6 and 8 show the respective beam pattern in the H- and E-plane from a single source with all other sources turned off, including the injection source. FIGS. 7 and 9 show the resultant coherent beam patterns for the corresponding planes when locking power is injected. Compared to the theoretical patterns given in FIGS. 2 and 3, good agreements are obtained, both in terms of relative amplitude of the main lobe to the side lobes, in beamwidth and in beam pattern maxima and minima locations. Thus, it can be concluded that substantial coherent power combining has been achieved.

Figure 10:
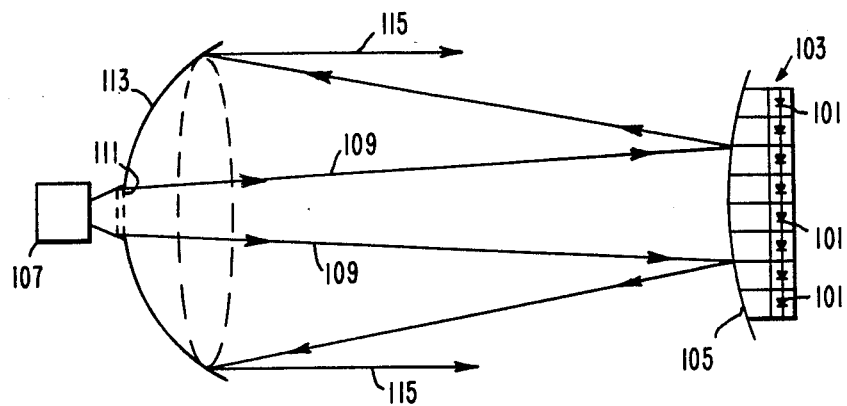
FIGS. 10 and 11 are on-axis schematic representations of illuminated subreflector injection locking embodiments, respectively, according to the present invention.

In still another injection locking embodiment according to the invention, an illuminated subreflector injecting locking arrangement is illustrated in FIG. 10. Oscillators 101 are imbedded in a waveguide array 103 which is mounted on an active subreflector 105. An injection source 107 provides injection energy 109 directed toward the subreflector 105 through an aperture 111 in a primary reflector 113, and the coherent output power from the waveguide array 103 is directed towards the primary reflector 113 which produces an output beam 115.

Figure 11:
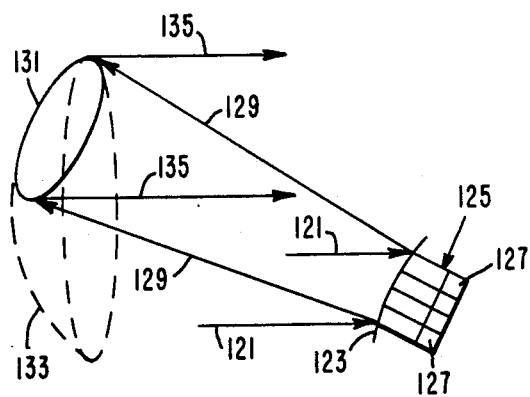

FIG. 11 illustrates an off-axis feed system according to the present invention from a conventional source (not shown) is directed toward an active subreflector 123 and enters a waveguide array 125 in which oscillators 127 are imbedded. The output wavefront energy 129 from the waveguide array 125 is then incident on an offset paraboloid portion 131 of a parent paraboloid outlined by dashes 133, from which portion 131 an output beam 135 is produced.

Figure 12:
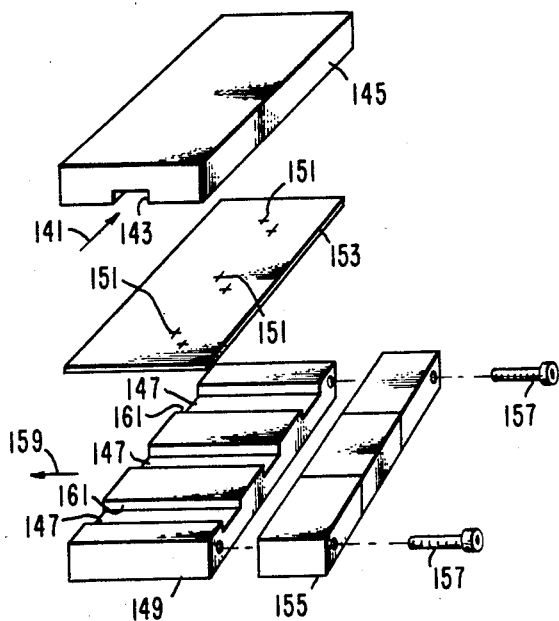
FIG. 12 is an exploded view of a coupler-coupled injection locking embodiment.

In yet a further embodiment of the present invention, shown in FIG. 12, a one-dimensional spatial power combiner, of a coupler-coupled injection locking type, is shown. In this embodiment, injection energy 141 is introduced at an injection port 143 of a conventional cross guide coupler 145 from where this array is coupled to individual waveguide pluralities 147 of an array 149 through coupling slots 151 in a plate 153 sandwiched between the cross guide coupler 145 and the array structure 149. This energy is thus seen by the individual oscillator elements in an oscillator array 155 that is mounted in place on one end of the array 149 by conventional bolts 157. The output power 159 from this one-dimensional arrangement propagates from the oscillator array 155, along the guides 147 and out array ports 161.

Figure 13:
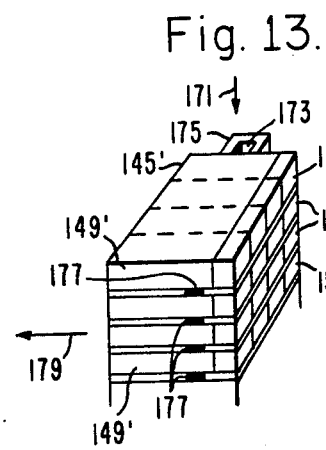
FIG. 13 is a two-dimensional spatial power combiner representation.

A two-dimensional spatial power combiner, of the coupler-coupled injection locking type, is illustrated in FIG. 13. One-dimensional oscillator arrays 155', similar to array 155 in FIG. 12, are stacked and coupled to stacked arrays 149'. Injection energy 171 is introduced to a master injection port 173 of a master coupler 175, while at the other end of each cross guide coupler 145', terminations 177 are disposed. Like in the one-dimensional embodiment of FIG. 12, output power 179 is produced at the end of the array 149' opposite that of the stacked oscillator arrays 155'.

A fourth class of injection locking of the spatial power combiner according to the invention is shown in FIGS. 14 and 15. In this embodiment, a master oscillator 181 generates injection energy 183 which is coupled to slave oscillators 185 surrounding the master oscillator through appropriate coupling holes 187 in inner array walls 189 to produce a coherent high power output 191 from the two-dimensional array 193.

From the foregoing, it should be evident that there has been herein described a new and improved spatial power combiner capable of combining a large number of power sources while exhibiting low overall loss and high combining efficiency.

What is claimed is:

1. A spatial power combiner for efficiently combining a plurality of power sources, comprising:
   oscillation means including a plurality of two-terminal negative resistance devices for producing free running oscillation energy from each of said negative resistance devices;
   a waveguide array having separate waveguide sections, each section including one of said negative resistance devices, said sections having interelement separation and individual radiation patterns resulting in an array main beam lobe having a relatively small bandwidth compared to array element bandwidth when phase synchronized; and
   phase synchronization means including an injection signal source producing injection signal energy coupled to each of said negative resistance devices for synchronizing said free running oscillation energy generated by said devices.

2. The spatial power combiner according to claim 1, wherein said injection signal source is coupled to said negative resistance devices producing master-slave injection locking.

3. The spatial power combiner according to claim 5, wherein said waveguide array includes a master waveguide section in which said injection signal source is disposed, said phase synchronization means including means for coupling said injection signal energy from said master waveguide section to the other of said waveguide sections for synchronizing said free running oscillation energy.

4. The spatial power combiner according to claim 1, wherein said injection signal source is coupled to said negative resistance device producing illumination injection locking.

5. The spatial power combiner according to claim 2, wherein said waveguide array includes an input end, and wherein said injection signal energy is directed at said input end.

6. The spatial power combiner according to claim 6, wherein said waveguide sections have parallel longitudinal axes, and wherein said injection signal energy is directed at a predetermined acute angle with respect to said longitudinal axes.

7. The spatial power combiner according to claim 7, also comprising a collecting aperture means disposed at approximately said predetermined acute angle with respect to said longitudinal axes on the side thereof opposite said injection signal source for collecting coherently combined output power exiting said waveguide array in the form of said main beam lobe.

8. The spatial power combiner according to claim 1, wherein said injection signal source is coupled to said negative resistance devices producing illuminated subreflector injection locking.

9. The spatial power combiner according to claim 3, also comprising a primary reflector and wherein said waveguide array includes an input end having a convex subreflector through which ouptut power from said negative resistance devices propagates toward a concave surface of said primary reflector, said injection signal energy from said injection signal source being directed toward said waveguide array through said subreflector.

10. The spatial power combiner according to claim 9, wherein said injection signal energy propagates through an aperture in said primary reflector at its axis and parallel to said axes of said waveguide array.

11. The spatial power combiner according to claim 9, wherein said primary reflector is a portion of a parent paraboloid configuration and said injection signal energy propagates toward said waveguide array and of said axes of said waveguide array.

12. The spatial power combiner according to claim 1, wherein said injection signal source is coupled to said negative resistance devices producing coupler-coupled injection locking.

13. The spatial power combiner according to claim 4, also comprising crossguide coupler means into which said injection signal energy is introduced, said crossguide coupler means being coupled to said waveguide sections for said synchronizing said free running oscillation energy.

14. The spatial power combiner according to claim 12, wherein said crossguide coupler means includes a plurality of crossguide coupler members each coupled to an associated one of said waveguide sections.

* * * * *